(12) United States Patent
Miyamoto et al.

(10) Patent No.: US 9,688,869 B2
(45) Date of Patent: Jun. 27, 2017

(54) CURABLE SILICONE COMPOSITION, AND OPTICAL SEMICONDUCTOR DEVICE

(71) Applicant: Dow Corning Toray Co., Ltd., Tokyo (JP)

(72) Inventors: Yusuke Miyamoto, Fuchu (JP); Akito Hayashi, Ichihara (JP); Akihiko Kobayashi, Ichihara (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/029,865

(22) PCT Filed: Oct. 8, 2014

(86) PCT No.: PCT/JP2014/077481
§ 371 (c)(1),
(2) Date: Apr. 15, 2016

(87) PCT Pub. No.: WO2015/056725
PCT Pub. Date: Apr. 23, 2015

(65) Prior Publication Data
US 2016/0280938 A1    Sep. 29, 2016

(30) Foreign Application Priority Data

Oct. 17, 2013    (JP) .................................. 2013-216853

(51) Int. Cl.
*H01L 33/00*    (2010.01)
*C09D 7/12*    (2006.01)
(Continued)

(52) U.S. Cl.
CPC ............ *C09D 7/1233* (2013.01); *C08L 83/04* (2013.01); *C08L 83/14* (2013.01); *C09D 183/04* (2013.01);
(Continued)

(58) Field of Classification Search
CPC ......... H01L 33/40; H01L 33/56; C08G 77/12; C08G 77/20; C09D 7/1233; C09D 183/04
(Continued)

(56) References Cited

U.S. PATENT DOCUMENTS 5,292,586 A * 3/1994 Lin ..................... C09J 183/04
                                              428/355 R
7,329,706 B2 * 2/2008 Fukui ..................... C08L 83/04
                                              524/588
(Continued)

FOREIGN PATENT DOCUMENTS

CN    102105537 A    6/2011
CN    102131874 A    7/2011
(Continued)

OTHER PUBLICATIONS

International Search Report for Application No. PCT/JP2014/077481 dated Dec. 22, 2014, 5 pages.
(Continued)

*Primary Examiner* — Brook Kebede
(74) *Attorney, Agent, or Firm* — Howard & Howard Attorneys PLLC

(57) ABSTRACT

The present invention provides a curable silicone composition for forming a cured product which inhibits the discoloration of silver electrodes or a silver-plated substrate in an optical semiconductor device due to a sulfur-containing gas, the curable silicone composition comprising: (A) an organopolysiloxane having at least two silicon-bonded alkenyl groups per molecule; (B) an organohydrogenpolysiloxane having at least two silicon-bonded hydrogen atoms per molecule; (C) an organic compound having an organic value of at least 175 in an organic conceptual diagram and having a specific group; and (D) a hydrosilylation reaction catalyst. In addition, the present invention provides an optical semiconductor device in which silver electrodes or a silver-plated (Continued)

substrate of an optical semiconductor device is sealed or covered with a cured product of the composition described above, the optical semiconductor device having excellent reliability after a sulfur resistance test.

13 Claims, 1 Drawing Sheet

(51) Int. Cl.

| | | |
|---|---|---|
| *C08L 83/04* | (2006.01) | |
| *C08L 83/14* | (2006.01) | |
| *H01L 33/56* | (2010.01) | |
| *C09D 183/04* | (2006.01) | |
| *H01L 33/40* | (2010.01) | |
| *C08G 77/12* | (2006.01) | |
| *C08G 77/20* | (2006.01) | |
| *C08K 5/04* | (2006.01) | |

(52) U.S. Cl.
CPC ............. *H01L 33/40* (2013.01); *H01L 33/56* (2013.01); *C08G 77/12* (2013.01); *C08G 77/20* (2013.01); *C08K 5/04* (2013.01); *H01L 2224/48091* (2013.01); *H01L 2224/48247* (2013.01); *H01L 2924/12044* (2013.01)

(58) Field of Classification Search
USPC .................................................. 257/98–100
See application file for complete search history.

(56) References Cited

U.S. PATENT DOCUMENTS

| 8,278,408 | B2 | 10/2012 | Goto et al. | |
|---|---|---|---|---|
| 8,373,286 | B2 | 2/2013 | Yoshitake et al. | |
| 2001/0034403 | A1* | 10/2001 | Takuman ............. | C08K 5/5419 524/588 |
| 2002/0010245 | A1* | 1/2002 | Enami ................... | C08K 9/06 524/430 |
| 2006/0270808 | A1 | 11/2006 | Imazawa et al. | |
| 2010/0103507 | A1 | 4/2010 | Imazawa et al. | |
| 2011/0172345 | A1 | 7/2011 | Goto et al. | |
| 2011/0227235 | A1 | 9/2011 | Yoshitake et al. | |

FOREIGN PATENT DOCUMENTS

| CN | 103044923 A | 4/2013 |
|---|---|---|
| EP | 0 767 207 A1 | 4/1997 |
| EP | 2 324 079 A | 3/2010 |
| EP | 2 305 755 A1 | 4/2011 |
| JP | H 09-95612 A | 4/1997 |
| JP | 2007-002233 A | 1/2007 |
| JP | 2010-084118 A | 4/2010 |
| JP | 2010-121117 A | 6/2010 |
| JP | 2012-111850 A | 6/2012 |
| JP | 2013-100464 A | 5/2013 |
| JP | 5559688 B2 | 7/2014 |
| KR | 2011-0036936 A | 4/2011 |
| KR | 2011-0053470 A | 5/2011 |
| KR | 2013-0040142 A | 4/2013 |
| TW | 201009021 A | 3/2010 |
| TW | 201014885 A | 4/2010 |
| TW | 2013-31299 A | 8/2013 |
| WO | WO 2010/010841 A1 | 1/2010 |
| WO | WO 2010/027105 A1 | 3/2010 |

OTHER PUBLICATIONS

English language abstract for CN 102105537 extracted from espacenet.com database on Apr. 21, 2016, 1 page.
English language abstract for CN 102131874 extracted from espacenet.com database on Apr. 21, 2016, 2 pages.
English language abstract and machine-assisted English translation for CN 103044923 extracted from espacenet.com database on Apr. 21, 2016, 23 pages.
English language abstract for JPH 09-95612 extracted from espacenet.com database on Apr. 21, 2016, 2 pages.
English language abstract for JP 2007-002233 extracted from espacenet.com database on Apr. 21, 2016, 1 page.
English language abstract for JP 2010-084118 extracted from espacenet.com database on Apr. 21, 2016, 2 pages.
English language abstract for JP 2010-121117 extracted from espacenet.com database on Apr. 21, 2016, 2 pages.
English language abstract and machine-assisted English translation for JP 2012-111850 extracted from espacenet.com database on Apr. 21, 2016, 41 pages.
English language abstract and machine-assisted English translation for JP 2013-100464 extracted from espacenet.com database on Apr. 21, 2016, 19 pages.
English language abstract not found for JP 5559688; however, see English language equivalent U.S. Pat. No. 8,278,408. Original document extracted from espacenet.com database on Apr. 21, 2016, 18 pages.
English language abstract not found for KR 2011-0036936; however, see English language equivalent U.S. Pat. No. 8,278,408. Original document extracted espacenet.com database on Apr. 21, 2016, 16 pages.
English language abstract not found for KR 2011-0053470; however, see English language equivalent U.S. Pat. No. 8,373,286. Original document extracted from espacenet.com database on Apr. 21, 2016, 24 pages.
English language abstract and machine-assisted English translation for KR 2013-0040142 extracted from espacenet.com database on Apr. 21, 2016, 24 pages.
English language abstract for TW 201009021 extracted from espacenet.com database on Apr. 21, 2016, 1 page.
English language abstract for TW 201014885 extracted from espacenet.com database on Apr. 21, 2016, 2 pages.
English language abstract and machine-assisted English translation for TW 201331299 extracted from espacenet.com database on Apr. 21, 2016, 20 pages.
English language abstract for WO 2010/010841 extracted from espacenet.com database on Apr. 21, 2016, 2 pages.

\* cited by examiner

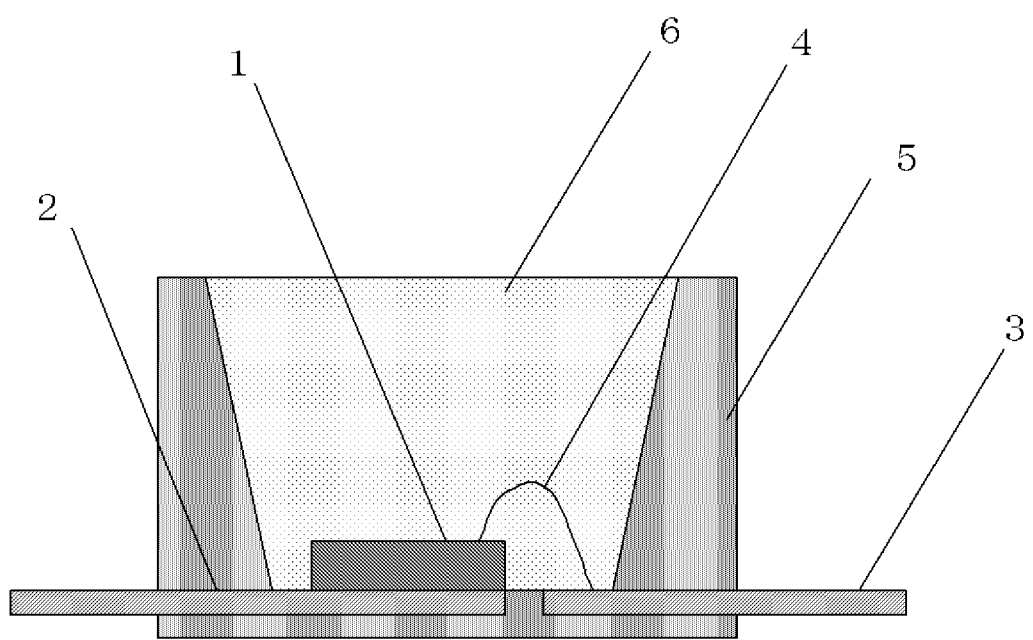

CURABLE SILICONE COMPOSITION, AND OPTICAL SEMICONDUCTOR DEVICE

CROSS-REFERENCE TO RELATED APPLICATIONS

This application is the National Stage of International Patent Application No. PCT/JP2014/077481, filed on Oct. 8, 2014, which claims priority to and all the advantages of Japanese Patent Application No. 2013-216853, filed on Oct. 17, 2013, the content of which is incorporated herein by reference.

TECHNICAL FIELD

The present invention relates to a curable silicone composition and an optical semiconductor device using the composition.

BACKGROUND ART

Curable silicone compositions which are cured by a hydrosilylation reaction are used to seal, cover, or adhere optical semiconductor elements in optical semiconductor devices. There is a demand for such a curable silicone composition to be able to inhibit the discoloration of silver electrodes or a silver-plated substrate in the optical semiconductor device due to a sulfur-containing gas such as hydrogen sulfide in the air.

For example, a sealing agent for an optical semiconductor element containing from 0.01 to 5 parts by mass of a zinc compound and from 0.01 to 5 parts by mass of a compound having a polyalkylene oxide chain per 100 parts by mass of a curable silicone composition comprising an organopolysiloxane having at least two silicon-bonded alkenyl groups, an organohydrogenpolysiloxane having at least two silicon-bonded hydrogen atoms, and a hydrosilylation-reaction catalyst has been proposed in Japanese Unexamined Patent Application Publication No. 2012-111850A.

However, it was determined that such a curable silicone composition has a problem in that the zinc compound and the silicon-bonded hydrogen atoms in the organopolysiloxane react during storage, which causes the curability to diminish over time. In addition, even such a curable silicone composition has a problem in that it cannot sufficiently inhibit the discoloration of silver electrodes or a silver-plated substrate in the optical semiconductor device due to a sulfur-containing gas in the air.

PRIOR ART DOCUMENTS

Patent Documents

Patent Document 1: Japanese Unexamined Patent Application Publication No. 2012-111850A

SUMMARY OF INVENTION

Technical Problem

An object of the present invention is to provide a curable silicone composition for forming a cured product which inhibits the discoloration of silver electrodes or a silver-plated substrate in an optical semiconductor device due to a sulfur-containing gas in the air. In addition, another object of the present invention is to provide an optical semiconductor device having excellent reliability after a sulfur resistance test.

Solution to Problem

The curable silicone composition of the present invention comprises:

(A) an organopolysiloxane having at least two silicon-bonded alkenyl groups per molecule;

(B) an organohydrogenpolysiloxane having at least two silicon-bonded hydrogen atoms per molecule, in an amount such that an amount of silicon-bonded hydrogen atoms in this component being from 0.1 to 10 mol per 1 mol of silicon-bonded alkenyl groups in component (A);

(C) an organic compound having an organic value of at least 175 in an organic conceptual diagram and having at least one type of group selected from the group consisting of —COOH, —C(O)OC(O)—, —CH$_2$CH$_2$CH$_2$OH, —CH$_2$CH(OH)—, —OCH(CH$_2$OH)—, —CHO(CH$_2$O—)$_2$, and —C(O)O—, in an amount of from 0.001 to 10 mass % with respect to the present composition; and (D) a platinum hydrosilylation reaction catalyst, in an amount such that an amount of platinum atoms in this component being from 0.01 to 500 ppm with respect to the present composition in terms of mass units.

Component (C) described above is preferably a fatty acid, an acid anhydride, a higher alcohol, a polyglycerin, a triglyceride, an ester, a sorbitan fatty acid ester, a glycerin fatty acid ester, a polyoxyethylene monoester, a polypropylene glycol monoester, a polybutylene glycol monoester, a polyoxyethylene diester, a polyoxyethylene alkyl ether ester, a polyoxytetramethylene diester, a polyoxyethylene fatty acid glyceryl, a polyoxyethylene sorbitan fatty acid ester, a mono-fatty acid polyoxyethylene-cured castor oil, or a mixture of two or more types thereof.

The curable silicone composition of the present invention is preferably a sealing agent or a coating agent for an optical semiconductor device.

The optical semiconductor device of the present invention is characterized in that it has a silver electrode or a silver-plated substrate, and the electrode or substrate is sealed or covered with a cured product of the curable silicone composition described above.

Advantageous Effects of Invention

The curable silicone composition of the present invention is characterized in that it forms a cured product which inhibits the discoloration of silver electrodes or a silver-plated substrate in an optical semiconductor device due to a sulfur-containing gas in the air. In addition, the optical semiconductor device of the present invention is characterized in that the discoloration of silver electrodes or a silver-plated substrate due to a sulfur-containing gas in the air is inhibited.

BRIEF DESCRIPTION OF THE DRAWING

FIG. 1 is a cross-sectional view of an LED that is an example of an optical semiconductor device of the present invention.

DESCRIPTION OF EMBODIMENTS

[Curable Silicone Composition]

First, the curable silicone composition of the present invention will be described in detail.

Component (A) is a base compound of the present composition and is an organopolysiloxane having at least two silicon-bonded alkenyl groups per molecule. Examples of the alkenyl groups include alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, among which vinyl groups are preferable. In addition, examples of groups bonding to silicon atoms other than alkenyl groups in component (A) include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenylpropyl groups; and groups in which some or all of the hydrogen atoms of these groups are substituted with halogen atoms such as fluorine atoms, chlorine atoms, or bromine atoms. Furthermore, the silicon atoms in component (A) may have small amounts of hydroxyl groups or alkoxy groups such as methoxy groups or ethoxy groups within a range that does not impair the object of the present invention.

Examples of the molecular structure of component (A) include a straight-chain structure, a partially branched straight-chain structure, a branched-chain structure, a cyclic structure, and a three-dimensional reticular structure. Component (A) may be one type of organopolysiloxane having these molecular structures or may be a mixture of two or more types of organopolysiloxanes having these molecular structures.

The content of alkenyl groups with respect to all of the silicon-bonded organic groups in such component (A) is preferably from 0.01 to 50 mol %, from 0.05 to 40 mol %, or from 0.09 to 32 mol %. This is because when the content of alkenyl groups is greater than or equal to the lower limit of the aforementioned range, the curability of the obtained cured product is good, whereas when the content of alkenyl groups is less than or equal to the upper limit of the aforementioned range, the mechanical characteristics of the obtained cured product are good. Here, the content of the alkenyl groups can be determined by analytical methods such as a Fourier transform infrared spectrophotometer (FT-IR), nuclear magnetic resonance (NMR), or gel permeation chromatography (GPC), for example.

Component (A) is a liquid or a solid at 25° C. If component (A) is a liquid at 25° C., the viscosity of the liquid at 25° C. is preferably in the range of from 1 to 1,000,000 mPa·s or in the range of from 10 to 1,000,000 mPa·s. This viscosity may, for example, be determined by measurement using a B-type viscometer in accordance with JIS K 7117-1.

Examples of such component (A) include dimethylpolysiloxanes capped at both molecular terminals with dimethylvinylsiloxy groups, dimethylsiloxane-methylvinylsiloxane copolymers capped at both molecular terminals with dimethylvinylsiloxy groups, dimethylsiloxane-methylphenylsiloxane copolymers capped at both molecular terminals with dimethylvinylsiloxy groups, methylphenylpolysiloxanes capped at both molecular terminals with dimethylvinylsiloxy groups, dimethylsiloxane-methylvinylsiloxane copolymers capped at both molecular terminals with trimethylsiloxy groups, dimethylsiloxane-methylvinylsiloxane-methylphenylsiloxane copolymers capped at both molecular terminals with trimethylsiloxy groups, copolymers consisting of a $(CH_3)_3SiO_{1/2}$ unit, a $(CH_3)_2(CH_2=CH)SiO_{1/2}$ unit, and an $SiO_{4/2}$ unit, copolymers consisting of a $(CH_3)_2(CH_2=CH)SiO_{1/2}$ unit and an $SiO_{4/2}$ unit, and mixtures of two or more types thereof.

Component (B) is a crosslinking agent of the present composition and is an organohydrogenpolysiloxane having at least two silicon-bonded hydrogen atoms per molecule. Examples of groups bonding to silicon atoms other than hydrogen atoms in component (B) include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenylpropyl groups; and groups in which some or all of the hydrogen atoms of these groups are substituted with halogen atoms such as fluorine atoms, chlorine atoms, or bromine atoms. Furthermore, the silicon atoms in component (B) may have small amounts of hydroxyl groups or alkoxy groups such as methoxy groups or ethoxy groups within a range that does not impair the object of the present invention.

Examples of the molecular structure of component (B) include straight-chain, partially branched straight-chain, branched chain, cyclic, and three-dimensional reticular structures, and the molecular structure is preferably a partially branched straight-chain, branched chain, or three-dimensional reticular structure.

Component (B) is a solid or a liquid at 25° C. If component (B) is a liquid at 25° C., the viscosity of the liquid at 25° C. is preferably at most 10,000 mPa·s, in the range of from 0.1 to 5,000 mPa·s, or in the range of from 0.5 to 1,000 mPa·s. This viscosity may, for example, be determined by measurement using a B-type viscometer in accordance with JIS K 7117-1.

Examples of such component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxanes capped at both molecular terminals with trimethylsiloxy groups, dimethylsiloxane-methylhydrogensiloxane copolymers capped at both molecular terminals with trimethylsiloxy groups, dimethylpolysiloxanes capped at both molecular terminals with dimethylhydrogensiloxy groups, dimethylsiloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, copolymers consisting of $(CH_3)_2HSiO_{1/2}$ units and $SiO_{4/2}$ units, copolymers consisting of $(CH_3)_2HSiO_{1/2}$ units, $SiO_{4/2}$ units, and $(C_6H_5)SiO_{3/2}$ units, and mixtures of two or more types thereof.

The content of component (B) is an amount such that the content of silicon-bonded hydrogen atoms in this component is from 0.1 to 10 mol and preferably from 0.5 to 5 mol per 1 mol of silicon-bonded alkenyl groups in component (A). This is because when the content of component (B) is less than or equal to the upper limit of the aforementioned range, the mechanical characteristics of the obtained cured product are good, whereas when the content of component (B) is greater than or equal to the lower limit of the aforementioned range, the curability of the obtained composition is good. Here, the content of the silicon-bonded hydrogen atom in component (B) can be determined by analytical methods such as a Fourier transform infrared spectrophotometer (FT-IR), nuclear magnetic resonance (NMR), or gel permeation chromatography (GPC), for example.

Component (C) is a component for inhibiting the discoloration of the silver electrodes or the silver-plated substrate in the optical semiconductor device due to a sulfur-containing gas in the air and is an organic compound having an organic value of at least 175 in an organic conceptual diagram and having at least one type of group selected from the group consisting of —COOH, —C(O)OC(O)—, —CH$_2$CH$_2$CH$_2$OH, —CH$_2$CH(OH)—, —OCH(CH$_2$OH)—, —CHO(CH$_2$O—)$_2$, and —C(O)O—.

Here, an "organic conceptual diagram" is a diagram in which the covalency of an organic compound is evaluated with an organic value (OV) and ionic bonding properties are evaluated with an inorganic value (IV), wherein the position of the organic compound is expressed as a point (OV, IV) on a rectangular coordinate plane using the organic axis as the horizontal axis and the inorganic axis as the vertical axis. In addition, the "organic value (OV)" is the sum of a value determined by multiplying the total number of carbon atoms of the organic compound by 20 and an organic value assigned to substituents (for example, fluorine groups: 5, chlorine groups: 40, bromine groups: 60, cyano groups: 20, nitro groups: 70, ethylenoxide groups: −10).

Such component (C) is preferably a fatty acid, an acid anhydride, a higher alcohol, a polyglycerin, a triglyceride, an ester, a sorbitan fatty acid ester, a glycerin fatty acid ester, a polyoxyethylene monoester, a polypropylene glycol monoester, a polybutylene glycol monoester, a polyoxyethylene diester, a polyoxyethylene alkyl ether ester, a polyoxytetramethylene diester, a polyoxyethylene fatty acid glyceryl, a polyoxyethylene sorbitan fatty acid ester, a mono-fatty acid polyoxyethylene-cured castor oil, or a mixture of two or more types thereof.

Examples of fatty acids include stearic acid, oleic acid, capric acid, lauric acid, myrystic acid, palmitic acid, behenic acid, linolic acid, hydroxystearic acid, and coconut oil fatty acid.

Examples of acid anhydrides include hexanoic acid anhydride, nonanoic acid anhydride, lauric acid anhydride, palmitic acid anhydride, stearic acid anhydride, oleic acid anhydride, and linolic acid anhydride.

Examples of higher alcohols include lauryl alcohol, myristyl alcohol, cetanol, stearyl alcohol, cetearyl alcohol, oleyl alcohol, and behenyl alcohol.

Examples of polylglycerins include monoallyl diglycerin, monoallyl tetraglycerin, triglycerin, and tetraglycerin.

Examples of triglycerides include medium chain fatty acid triglycerides, glyceryl tri-2-ethylhexanoate, glyceryl tricaprylate, and glyceryl tri(caprylate/caprate).

Examples of esters include cetyl myristate, octyldodecyl myristate, isopropyl myristate, isopropyl palmitate, butyl stearate, stearyl stearate, ethyl oleate, decyl oleate, diethyl sebacate, dioctyl sebacate, neopentyl glycol di-2-ethylhexanoate, pentaerythrite tetra-2-ethylhexanoate, ethylene glycol distearate, 2-ethylhexyl palmitate, 2-ethylhexyl stearate, isotridecyl isononanoate, isodecyl isononanoate, ethylhexylpalmitate, hexyldecylethyl hexanoate, PEG-4-diheptanoate, isostearyl neopentanoate, tridecyl neopentanoate, cetyl octanoate, cetyl palmitate, cetyl ricinoleate, cetyl stearate, cetyl myristate, coco-dicaprylate/caprylate, decyl isostearate, isodecyl oleate, isodecyl neopentanoate, isohexyl neopentanoate, octyl palmitate, dioctyl maleate, tridecyl octanoate, myristyl myristate, and octyl dodecanoate.

Examples of sorbitan fatty acid esters include sorbitan monolaurate, sorbitan monopalmitate, sorbitan monostearate, sorbitan monooleate, sorbitan sesquilaurate, sorbitan sesquipalmitate, sorbitan sesquistearate, sorbitan sesquioleate, sorbitan trilaurate, sorbitan tripalmitate, sorbitan tristearate, and sorbitan trioleate.

Examples of glycerin fatty acid esters include lipophilic glycerin monostearate, lipophilic glycerin monooleate, and polyglyceryl monolaurate.

Examples of polyoxyethylene monoesters include polyethylene glycol monolaurate, polyethylene glycol monooleate, polyethylene glycol monostearate, polyethylene glycol myristate, and polyethylene glycol monoisostearate.

Examples of polypropylene glycol monoesters include propylene glycol laurate, propylene glycol monooleate, and castor oil fatty acid polypropylene glycol.

Examples of polybutylene glycol monoesters include butylene glycol laurate and butylene glycol stearate.

Examples of polyoxyethylene diesters include polyethylene glycol dilaurate, polyethylene glycol dipalmitate, polyethylene glycol dioleate, polyethylene glycol distearate, and polyethylene glycol diisostearate.

Examples of polyoxyethylene alkyl ether esters include polyoxyethylene myristyl ether myristate, polyoxyethylene cetyl ether stearate, and polyoxyethylene stearyl ether stearate.

Examples of polyoxytetramethylene diesters include polyoxytetramethylene myristyl ether myristate, polyoxytetramethylene cetyl ether stearate, and polyoxytetramethylene stearyl ether stearate.

Examples of polyoxyethylene fatty acid glyceryls include polyoxyethylene glyceryl caprylate, polyoxyethylene glyceryl (caprylate/caprate), polyoxyethylene glyceryl laurate, polyoxyethylene glyceryl stearate, polyoxyethylene glyceryl oleate, polyoxyethylene glyceryl tallowate, polyoxyethylene coconut oil fatty acid glyceryl, polyoxyethylene glyceryl isostearate, and polyoxyethylene glyceryl triisostearate.

Examples of polyoxyethylene sorbitan fatty acid esters include polyoxyethylene sorbitan monolaurate, polyoxyethylene sorbitan monopalmitate, polyoxyethylene sorbitan monooleate, polyoxyethylene sorbitan monostearate, polyoxyethylene sorbitan isostearate, polyoxyethylene sorbitan trioleate, and polyoxyethylene sorbitan tristearate.

Examples of mono-fatty acid polyoxyethylene-cured castor oils include polyoxyethylene succinate-cured castor oil, polyoxyethylene laurate-cured castor oil, and polyoxyethylene monoisostearate-cured castor oil.

The content of component (C) is an amount in the range of from 0.001 to 10 mass % and preferably an amount in the range of from 0.01 to 7 mass % or in the range of from 0.1 to 5 mass % in the present composition. This is because when the content of component (C) is greater than or equal to the lower limit of the aforementioned range, the discoloration of the silver electrodes or the silver-plated substrate can be sufficiently suppressed, whereas when the content is less than or equal to the upper limit of the aforementioned range, the storage stability of the obtained composition is improved.

Component (D) is a platinum hydrosilylation reaction catalyst used to accelerate the curing of the present composition. Examples of component (D) include finely powdered platinum; platinum black; chloroplatinic acid, alcohol-modified chloroplatinic acid; chloroplatinic acid/diolefin complexes; platinum/olefin complexes; platinum/carbonyl complexes such as platinum bis(acetoacetate), and platinum bis(acetylacetonate); chloroplatinic acid/alkenylsiloxane complexes such as chloroplatinic acid/divinyltetramethyl disiloxane complexes, and chloroplatinic acid/tetravinyl tetramethyl cyclotetrasiloxane complexes; platinum/alkenylsiloxane complexes such as platinum/divinyltetramethyl disiloxane complexes, and platinum/tetravinyl tetramethyl cyclotetrasiloxane complexes; complexes of chloroplatinic acid and acetylene alcohols; and mixtures of two or more types thereof. In particular, platinum-alkenylsiloxane complexes are preferable in that they yield an excellent accelerating effect.

Examples of the alkenylsiloxane used in the platinum-alkenylsiloxane complex include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable in that the stability of the platinum-alkenylsiloxane complex that is produced is good.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

The content of component (D) is an amount such that the content of platinum atoms in component (D) is in the range of from 0.01 to 500 ppm, preferably in the range of from 0.01 to 100 ppm or in the range of from 0.1 to 50 ppm in terms of mass units with respect to the present composition. This is because when the content of component (D) is greater than or equal to the lower limit of the aforementioned range, the curability of the obtained composition is good, whereas when the content of component (D) is less than or equal to the upper limit of the aforementioned range, the coloration of the obtained cured product is suppressed.

The present composition may contain (E) a hydrosilylation reaction suppressing agent in order to prolong the usable time at ambient temperature and to improve storage stability. Examples of component (E) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; methylalkenylsiloxane oligomers such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes such as dimethyl bis(3-methyl-1-butyn-3-oxy)silane and methylvinyl bis(3-methyl-1-butyn-3-oxy)silane, and triallylisocyanurate compounds.

The content of component (E) is not limited but is preferably in the range of from 0.0001 to 5 parts by mass or in the range of from 0.01 to 3 parts by mass per 100 parts by mass of the present composition.

In addition, the present composition may also contain (F) a triazole-based compound so that the discoloration of silver electrodes or a silver-plated substrate due to a sulfur-containing gas in the air can be further suppressed. Examples of component (F) include 1H-1,2,3-triazole, 2H-1,2,3-triazole, 1H-1,2,4-triazole, 4H-1,2,4-triazole, 2-(2'-hydroxy-5'-methylphenyl)benzotriazole, benzotriazole, tolyltriazole, carboxybenzotriazole, methyl 1H-benzotriazole-5-carboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N,N-bis(2-ethylhexyl)-[(1,2,4-triazole-1-methyl]amine, 1-[N,N-bis(2-ethylhexyl)aminomethyl]benzotriazole, 1-[N,N-bis(2-ethylhexyl)aminomethyl]tolyltriazole, 1-[N,N-bis(2-ethylhexyl)aminomethyl]carboxybenzotriazole, 1-[N,N-bis(2-hydroxyethyl)-aminomethyl]benzotriazole, 1-[N,N-bis(2-hydroxyethyl)-aminomethyl]tolyltriazole, 1-[N,N-bis(2-hydroxyethyl)-aminomethyl]carboxybenzotriazole, 1-[N,N-bis(2-hydroxypropyl)aminomethyl]carboxybenzotriazole, 1-[N,N-bis(1-butyl)aminomethyl]carboxybenzotriazole, 1-[N,N-bis(1-octyl)aminomethyl]carboxybenzotriazole, 1-(2',3'-di-hydroxypropyl)benzotriazole, 1-(2',3'-di-carboxyethyl)benzotriazole, 2-(2'-hydroxy-3',5'-di-tert-butylphenyl)benzotriazole, 2-(2'-hydroxy-3',5'-amylphenyl)benzotriazole, 2-(2'-hydroxy-4'-octoxyphenyl)benzotriazole, 2-(2'-hydroxy-5'-tert-butylphenyl)benzotriazole, 1-hydroxybenzotriazole-6-carboxylic acid, 1-oleoylbenzotriazole, 1,2,4-triazole-3-ol, 5-amino-3-mercapto-1,2,4-triazole, 5-amino-1,2,4-triazole-3-carboxylic acid, 1,2,4-triazole-3-carboxyamide, 4-aminourazole, and 1,2,4-triazol-5-one.

The content of component (F) is not particularly limited but is an amount in the range of from 0.000001 to 3 parts by mass or an amount in the range of from 0.00001 to 1 part by mass per total of 100 parts by mass of components (A) to (D) described above.

In addition, the present composition may also contain an adhesion promoter in order to further improve adhesion to the substrate with which the composition makes contact during curing. This adhesion promoter is preferably an organic silicon compound having one or more silicon-bonded alkoxy groups per molecule. Examples of the alkoxy groups include methoxy groups, ethoxy groups, propoxy groups, butoxy groups, and methoxyethoxy groups, and methoxy groups or ethoxy groups are particularly preferable. Examples of groups other than alkoxy groups bonding with the silicon atoms of this organic silicon compound include the same halogen-substituted or unsubstituted monovalent hydrocarbon groups as those described above such as alkyl groups, alkenyl groups, aryl groups, aralkyl groups, and halogenated alkyl groups; glycidoxyalkyl groups such as 3-glycidoxypropyl groups and 4-glycidoxybutyl groups; epoxycyclohexylalkyl groups such as 2-(3,4-epoxycyclohexyl)ethyl groups and 3-(3,4-epoxycyclohexyl)propyl groups; oxyranylalkyl groups such as 4-oxyranylbutyl groups and 8-oxyranyloctyl groups; acrylic group-containing monovalent organic groups such as 3-methacryloxypropyl groups; isocyanate groups; isocyanurate groups; and hydrogen atoms. The organic silicon compound preferably has a group that can react with the alkenyl groups and/or silicon-bonded hydrogen atoms in the present composition.

Specifically, the organic silicon compound preferably has silicon-bonded aliphatic unsaturated hydrocarbon groups or silicon-bonded hydrogen atoms.

The content of the adhesion promoter is not limited but is preferably in the range of from 0.01 to 10 parts by mass or in the range of from 0.1 to 3 parts by mass per 100 parts by mass of the present composition.

In addition, the present composition may also contain a fluorescent substance as an optional component. Examples of this fluorescent substance include yellow, red, green, and blue light emitting fluorescent substances composed of oxide fluorescent substances, oxynitride fluorescent substances, nitride fluorescent substances, sulfide fluorescent substances, oxysulfide fluorescent substances, or the like, which are widely used in light emitting diodes (LEDs), and mixtures of at least two types thereof. Examples of oxide fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate-type green to yellow light-emitting fluorescent substances containing cerium or europium ions.

Examples of oxynitride fluorescent substances include silicon, aluminum, oxygen, and nitrogen-type SiAlON red to green light-emitting fluorescent substances containing europium ions. Examples of nitride fluorescent substances include calcium, strontium, aluminum, silicon, and nitrogen-type CASN red light-emitting fluorescent substances containing europium ions. Examples of sulfide fluorescent substances include ZnS green light-emitting fluorescent substances containing copper ions or aluminum ions. Examples of oxysulfide fluorescent substances include $Y_2O_2S$ red light-emitting fluorescent substances containing europium ions.

The content of the fluorescent substance is not particularly limited but is preferably in the range of from 0.1 to 70 mass % or in the range of from 1 to 20 mass % in the present composition.

In addition, the present composition may also contain one or more types of inorganic fillers selected from silica, glass, alumina, and the like; silicone rubber powders; resin powders such as silicone resins and polymethacrylate resins; and one or more types of components selected from heat resistant agents, dyes, pigments, flame retarders, surfactants, solvents, and the like as other optional components, as long as the object of the present invention is not undermined.

The present composition is such that curing proceeds either when left to stand at room temperature or when heated, but it is preferable to heat the composition in order to achieve rapid curing. The heating temperature is preferably in the range of from 50 to 200° C.

The present composition preferably forms a cured product with a type A durometer hardness of from 15 to 99 or from 30 to 95 as prescribed by JIS K 6253 when cured. This is because when the hardness of the cured product of the curable silicone composition is greater than or equal to the lower limit of the aforementioned range, it is strong and demonstrates sufficient protection, whereas when the hardness is less than or equal to the upper limit of the aforementioned range, the cured product becomes flexible and the durability is sufficient.

Next, the optical semiconductor device of the present invention will be described in detail.

The optical semiconductor device of the present invention is characterized in that it has a silver electrode or a silver-plated substrate, and the electrode or substrate is sealed or covered with a cured product of the curable silicone composition described above. Examples of the optical semiconductor element in the optical semiconductor device include light-emitting diode (LED) elements, semiconductor laser elements, photodiode elements, phototransistor elements, solid-state image sensing devices, and light emitters and receivers for photocouplers; and the optical semiconductor element is particularly preferably a light-emitting diode (LED) element.

The optical semiconductor device of the present invention will be explained in further detail by means of FIG. 1.

FIG. 1 illustrates a cross-sectional view of a surface mounted type LED, which is one example of the optical semiconductor device of the present invention. In the LED illustrated in FIG. 1, the optical semiconductor element 1 is die-bonded to a lead frame 2, and this optical semiconductor element 1 is further wire-bonded to a lead frame 3 by a bonding wire 4. At the periphery of this optical semiconductor element 1, a light reflection material 5 is formed, and the optical semiconductor element 1 inside this light reflection material 5 is sealed by a cured product 6 of the curable silicone composition described above.

An example of a method of producing the surface mounted type LED illustrated in FIG. 1 is a method of die-bonding the optical semiconductor element 1 onto the lead frame 2 inside the light reflection material 5, wire-bonding the optical semiconductor element 1 and the lead frame 3 with a gold bonding wire 4, and then resin-sealing the optical semiconductor element 1 with the curable silicone composition described above.

EXAMPLES

The curable silicone composition and the optical semiconductor device of the present invention will be described in detail hereinafter using Practical Examples and Comparative Examples. In the chemical formulae, Me represents a methyl group, Vi represents a vinyl group, and Ph represents a phenyl group.

Practical Examples 1 to 10 and Comparative Examples 1 to 10

The following components were uniformly mixed according to the compositions (parts by mass) shown in the following Tables 1 and 2 to prepare the curable silicone compositions of Practical Examples 1 to 10 and Comparative Examples 1 to 10. Moreover, in Tables 1 and 2, "SiH/Vi" represents the total moles of silicon-bonded hydrogen atoms in component (B) per 1 mole of total vinyl groups in component (A) in the curable silicone composition.

The following components were used as component (A). Here, an organopolysiloxane can be obtained by a publicly known production method. In addition, the viscosity was the value at 25° C. and was measured using a type B viscometer in accordance with JIS K 7117-1.

Component (a-1): a methylphenylpolysiloxane having a viscosity of 1,000 mPa·s and represented by the average formula:

Me$_2$ViSiO(MePhSiO)$_{30}$SiMe$_2$Vi (vinyl group content=1.27 mass %; 3.0 mol %)
Component (a-2): a methylphenylpolysiloxane having a viscosity of 15,000 mPa·s and represented by the average formula:

Me$_2$ViSiO(MePhSiO)$_{120}$SiMe$_2$Vi (vinyl group content=0.33 mass %; 0.8 mol %)
Component (a-3): a white solid at 25° C. and toluene-soluble organopolysiloxane having two or more vinyl groups per molecule and represented by the average unit formula:

(PhSiO$_{3/2}$)$_{0.75}$(Me$_2$ViSiO$_{1/2}$)$_{0.25}$ (vinyl group content=5.6 mass %; 16.7 mol %)
Component (a-4): a white solid at 25° C. and toluene-soluble organopolysiloxane having two or more vinyl groups per molecule and represented by the average unit formula:

(MePhViSiO$_{1/2}$)$_{0.23}$(PhSiO$_{3/2}$)$_{0.77}$ (vinyl group content=4.6 mass %; 15.8 mol %)
Component (a-5): a dimethylpolysiloxane capped at both molecular terminals with dimethylvinylsiloxy groups having a viscosity of 300 mPa·s and represented by the average formula:

Me$_2$ViSiO(Me$_2$SiO)$_{150}$SiMe$_2$Vi (vinyl group content=0.48 mass %; 0.7 mol %)
Component (a-6): a dimethylpolysiloxane capped at both molecular terminals with dimethylvinylsiloxy groups having a viscosity of 10,000 mPa·s and represented by the average formula:

Me$_2$ViSiO(Me$_2$SiO)$_{500}$SiMe$_2$Vi (vinyl group content=0.15 mass %; 0.2 mol %)
Component (a-7): a white solid at 25° C. and toluene-soluble organopolysiloxane having two or more vinyl groups per molecule and represented by the average unit formula:

(Me$_2$ViSiO$_{1/2}$)$_{0.15}$(Me$_3$SiO$_{1/2}$)$_{0.38}$(SiO$_{4/2}$)$_{0.47}$ (vinyl group content=5.5 mass %; 9.4 mol %)
Component (a-8): a white solid at 25° C. and toluene-soluble organopolysiloxane resin having two or more vinyl groups per molecule and represented by the average unit formula:

(Me$_2$ViSiO$_{1/2}$)$_{0.13}$(Me$_3$SiO$_{1/2}$)$_{0.45}$(SiO$_{4/2}$)$_{0.42}$ (vinyl group content=4.7 mass %; 7.5 mol %)
The following components were used as component (B). Here, an organohydrogenpolysiloxane can be obtained by a publicly known production method. The viscosity was the value at 25° C. and was measured using a type B viscometer in accordance with JIS K 7117-1. In addition, the content of silicon-bonded hydrogen atoms and the number of silicon-bonded hydrogen atoms per molecule were measured by analytical techniques such as FT-IR, NMR, or GPC.
Component (b-1): a diphenylpolysiloxane capped at both molecular terminals with dimethylhydrogensiloxy groups having a viscosity of 5 mPa·s and represented by the average formula:

HMe$_2$SiO(Ph$_2$SiO)SiMe$_2$H (silicon-bonded hydrogen atom content=0.6 mass %)

Component (b-2): a branched-chain organopolysiloxane with a viscosity of 25 mPa·s having two or more silicon-bonded hydrogen atoms per molecule and represented by the average unit formula:

(PhSiO$_{3/2}$)$_{0.4}$(HMe$_2$SiO$_{1/2}$)$_{0.6}$ (silicon-bonded hydrogen atom content=0.65 mass %)
Component (b-3): a polymethylhydrogensiloxane capped at both molecular terminals with trimethylsiloxy groups having a viscosity of 20 mP·s and represented by the average formula:

Me$_3$SiO(MeHSiO)$_{55}$SiMe$_3$ (silicon-bonded hydrogen atom content=1.6 mass %)
Component (b-4): a dimethylsiloxane-methylhydrogensiloxane copolymer capped at both molecular terminals with trimethylsiloxy groups having a viscosity of 5 mPa·s and represented by the average formula:

Me$_3$SiO(MeHSiO)$_{15}$SiMe$_3$ (silicon-bonded hydrogen atom content=1.42 mass %)
The following components were used as component (C).
Component (c-1): isodecylisononanoate (organic value=360)
Component (c-2): sorbitan sesquioleate (organic value=1,320)
Component (c-3): monoallyl diglycerin (organic value=180)
Component (c-4): polyoxyethylene glyceryl isostearate (organic value=730)
Component (c-5): monoallyl glycerin (organic value=120)
Component (c-6): polyoxyethylene monoallyl ether (organic value=170)
A 1,3-divinyltetramethyldisiloxane solution of a 1,3-divinyltetramethyl disiloxane platinum complex (platinum metal content in terms of mass units in this component=approximately 4,000 ppm) was used as component (D).
1-Ethynylcyclohexan-1-ol was used as component (E).
[Evaluation and Results]
The results of measurements of the cured products and measurements of sulfidation resistance of the optical semiconductor device are shown in Tables 1 and 2 for the curable silicone compositions obtained in Practical Examples 1 to 10 and Comparative Examples 1 to 10.
[Hardness of Cured Product]
The curable silicone composition was press-molded under a pressure of 5 MPa for 1 hour at 150° C. to produce a sheet-like cured product. The hardness of the sheet-like cured product was measured by a type A durometer as specified in JIS K 6253.
[Production of Optical Semiconductor Device]
In addition, the optical semiconductor device illustrated in FIG. 1 was created by heating the curable silicone composition for 1 hour at 150° C. The sulfidation resistance was measured as follows by measuring the radiant flux of the optical semiconductor device.
[Sulfidation Resistance]
An initial radiant flux measurement was performed on the optical semiconductor device using a total radiant flux measurement apparatus utilizing integrating spheres. Next, this optical semiconductor device was placed in an autoclave with sodium sulfide hexahydrate, heated to 50° C., and was left to stand for 48 hours. A radiant flux measurement was then performed using a total radiant flux measurement apparatus utilizing integrating spheres.

TABLE 1

| Item | | | Practical Example 1 | Practical Example 2 | Practical Example 3 | Practical Example 4 | Practical Example 5 |
|---|---|---|---|---|---|---|---|
| Composition of curable silicone composition (parts by mass) | Component (A) | Component (a-1) | 35 | — | 35 | — | — |
| | | Component (a-2) | 10 | — | 10 | — | — |
| | | Component (a-3) | 40 | — | 40 | — | — |
| | | Component (a-4) | — | 78 | — | 78 | 78 |
| | Component (B) | Component (b-1) | 10 | 22 | 10 | 22 | 22 |
| | | Component (b-2) | 5 | — | 5 | — | — |
| | Component (C) | Component (c-1) | 5 | — | — | — | — |
| | | Component (c-2) | — | 5 | — | — | 3 |
| | | Component (c-3) | — | — | 5 | — | — |
| | | Component (c-4) | — | — | — | 5 | — |
| | | Component (c-5) | — | — | — | — | — |
| | | Component (c-6) | — | — | — | — | — |
| | Component (D) | | 0.1 | 0.1 | 0.1 | 0.1 | 0.1 |
| | Component (E) | | 0.1 | 0.1 | 0.1 | 0.1 | 0.1 |
| | SiH/Vi | | 0.9 | 1.0 | 0.9 | 1.0 | 1.0 |
| | Hardness of the cured product | | 50 | 90 | 50 | 90 | 90 |
| Sulfidation resistance | Initial light extraction efficiency (%) | | 100 | 100 | 100 | 100 | 100 |
| | Light extraction efficiency after 48 hours (%) | | 98 | 99 | 98 | 99 | 98 |

| Item | | | Comparative Example 1 | Comparative Example 2 | Comparative Example 3 | Comparative Example 4 | Comparative Example 5 |
|---|---|---|---|---|---|---|---|
| Composition of curable silicone composition (parts by mass) | Component (A) | Component (a-1) | 35 | — | 35 | — | — |
| | | Component (a-2) | 10 | — | 10 | — | — |
| | | Component (a-3) | 40 | — | 40 | — | — |
| | | Component (a-4) | — | 78 | — | 78 | 78 |
| | Component (B) | Component (b-1) | 10 | 22 | 10 | 22 | 22 |
| | | Component (b-2) | 5 | — | 5 | — | — |
| | Component (C) | Component (c-1) | — | — | — | — | — |
| | | Component (c-2) | — | — | — | — | 15 |
| | | Component (c-3) | — | — | — | — | — |
| | | Component (c-4) | — | — | — | — | — |
| | | Component (c-5) | 5 | — | — | — | — |
| | | Component (c-6) | — | 5 | — | — | — |
| | Component (D) | | 0.1 | 0.1 | 0.1 | 0.1 | 0.1 |
| | Component (E) | | 0.1 | 0.1 | 0.1 | 0.1 | 0.1 |
| | SiH/Vi | | 0.9 | 1.0 | 0.9 | 1.0 | 1.0 |
| | Hardness of the cured product | | 50 | 90 | 70 | 90 | 90 |
| Sulfidation resistance | Initial light extraction efficiency (%) | | 100 | 100 | 100 | 100 | 73 |
| | Light extraction efficiency after 48 hours (%) | | 87 | 89 | 87 | 89 | 59 |

TABLE 2

| Item | | | Practical Example 6 | Practical Example 7 | Practical Example 8 | Practical Example 9 | Practical Example 10 |
|---|---|---|---|---|---|---|---|
| Composition of curable silicone composition (parts by mass) | Component (A) | Component (a-5) | 30 | — | 30 | — | — |
| | | Component (a-6) | 28 | 35 | 28 | 35 | 35 |
| | | Component (a-7) | 35 | — | 35 | — | — |
| | | Component (a-8) | — | 55 | — | 55 | 55 |
| | Component (B) | Component (b-3) | 7 | 4 | 7 | 4 | 4 |
| | | Component (b-4) | — | 5 | — | 5 | 5 |
| | Component (C) | Component (c-1) | 5 | — | — | — | — |
| | | Component (c-2) | — | 5 | — | — | 3 |
| | | Component (c-3) | — | — | 5 | — | — |
| | | Component (c-4) | — | — | — | 5 | — |
| | | Component (c-5) | — | — | — | — | — |
| | | Component (c-6) | — | — | — | — | — |
| | Component (D) | | 0.1 | 0.1 | 0.1 | 0.1 | 0.1 |
| | Component (E) | | 0.1 | 0.1 | 0.1 | 0.1 | 0.1 |
| | SiH/Vi | | 1.7 | 1.9 | 1.7 | 1.9 | 1.9 |
| | Hardness of the cured product | | 70 | 90 | 70 | 90 | 90 |

TABLE 2-continued

| | | | | | | | |
|---|---|---|---|---|---|---|---|
| Sulfidation resistance | Initial light extraction efficiency (%) | | 100 | 100 | 100 | 100 | 100 |
| | Light extraction efficiency after 48 hours (%) | | 80 | 82 | 80 | 82 | 81 |

| | | | Category | | | | |
|---|---|---|---|---|---|---|---|
| | Item | | Comparative Example 6 | Comparative Example 7 | Comparative Example 8 | Comparative Example 9 | Comparative Example 10 |
| Composition of curable silicone (parts by mass) | Component (A) | Component (a-5) | 30 | — | 30 | — | — |
| | | Component (a-6) | 28 | 35 | 28 | 35 | 35 |
| | | Component (a-7) | 35 | — | 35 | — | — |
| | | Component (a-8) | — | 55 | — | 55 | 55 |
| | Component (B) | Component (b-3) | 7 | 4 | 7 | 4 | 4 |
| | | Component (b-4) | — | 5 | — | 5 | 5 |
| | Component (C) | Component (c-1) | — | — | — | — | — |
| | | Component (c-2) | — | — | — | — | 15 |
| | | Component (c-3) | — | — | — | — | — |
| | | Component (c-4) | — | — | — | — | — |
| | | Component (c-5) | 5 | — | — | — | — |
| | | Component (c-6) | — | 5 | — | — | — |
| | Component (D) | | 0.1 | 0.1 | 0.1 | 0.1 | 0.1 |
| | Component (E) | | 0.1 | 0.1 | 0.1 | 0.1 | 0.1 |
| | SiH/Vi | | 1.7 | 1.9 | 1.7 | 1.9 | 1.9 |
| | Hardness of the cured product | | 70 | 90 | 70 | 90 | 90 |
| Sulfidation resistance | Initial light extraction efficiency (%) | | 100 | 100 | 100 | 100 | 70 |
| | Light extraction efficiency after 48 hours (%) | | 70 | 73 | 70 | 73 | 42 |

It was confirmed from the results shown in Tables 1 and 2 that the optical semiconductor devices produced using the curable silicone compositions of Practical Examples 1 to 10 have sulfidation resistance.

INDUSTRIAL APPLICABILITY

The curable silicone composition of the present invention can form a cured product which inhibits the discoloration of silver electrodes or a silver-plated substrate due to a sulfur-containing gas in the air, and it is therefore suitable as a sealing agent, a coating agent, or an adhesive for an optical semiconductor element in an optical semiconductor device or as a protective agent of a silver electrode or a silver-plated substrate of a liquid crystal terminal.

REFERENCE NUMERALS

1 Optical semiconductor element
2 Lead frame
3 Lead frame
4 Bonding wire
5 Reflective member
6 Cured product of the curable silicone composition

The invention claimed is:

1. A curable silicone composition comprising at least:
(A) an organopolysiloxane having at least two silicon-bonded alkenyl groups per molecule;
(B) an organohydrogenpolysiloxane having at least two silicon-bonded hydrogen atoms per molecule, in an amount such that an amount of silicon-bonded hydrogen atoms in this component is from 0.1 to 10 mol per 1 mol of silicon-bonded alkenyl groups in component (A);
(C) an organic compound having an organic value (OV) of at least 175 in an organic conceptual diagram and having at least one group selected from the group consisting of —COOH, —C(O)OC(O)—, —CH$_2$CH$_2$CH$_2$OH, —CH$_2$CH(OH)—, —OCH(CH$_2$OH)—, —CHO(CH$_2$O—)$_2$, and —C(O)O—, in an amount of from 0.001 to 10 mass % with respect to the composition, wherein the organic value (OV) is the sum of a value determined by multiplying the total number of carbon atoms of the organic compound (C) by 20 and an organic value assigned to substituents and wherein the organic conceptual diagram is a diagram in which the covalency of the organic compound (C) is evaluated with the organic value (OV) and ionic bonding properties are evaluated with an inorganic value (IV), wherein the position of the organic compound (C) is expressed as a point (OV, IV) on a rectangular coordinate plane using the organic axis as the horizontal axis and the inorganic axis as the vertical axis; and
(D) a platinum hydrosilylation reaction catalyst, in an amount such that an amount of platinum atoms in this component is from 0.01 to 500 ppm with respect to the composition in terms of mass units.

2. The curable silicone composition according to claim 1, wherein component (C) is at least one organic compound selected from the group consisting of a fatty acid, an acid anhydride, a higher alcohol, a polyglycerin, a triglyceride, an ester, a sorbitan fatty acid ester, a glycerin fatty acid ester, a polyoxyethylene monoester, a polypropylene glycol monoester, a polybutylene glycol monoester, a polyoxyethylene diester, a polyoxyethylene alkyl ether ester, a polyoxytetramethylene diester, a polyoxyethylene fatty acid glyceryl, a polyoxyethylene sorbitan fatty acid ester, a mono-fatty acid polyoxyethylene-cured castor oil, and a mixture of two or more thereof.

3. The curable silicone composition according to claim 1, wherein component (C) is at least one ester selected from the group consisting of cetyl myristate, octyldodecyl myristate, isopropyl myristate, isopropyl palmitate, butyl stearate, stearyl stearate, ethyl oleate, decyl oleate, diethyl sebacate, dioctyl sebacate, neopentyl glycol di-2-ethylhexanoate, pentaerythrite tetra-2-ethylhexanoate, ethylene glycol distearate, 2-ethylhexyl palmitate, 2-ethylhexyl stearate, isotridecyl isononanoate, isodecyl isononanoate, ethylhexylpalmitate, hexyldecylethyl hexanoate, PEG-4-diheptanoate, isostearyl neopentanoate, tridecyl neopentanoate, cetyl octanoate, cetyl palmitate, cetyl ricinoleate, cetyl stearate, cetyl myristate, coco-dicaprylate/caprylate, decyl isostearate, isodecyl oleate, isodecyl neopentanoate, isohexyl neopentanoate, octyl palmitate, dioctyl maleate, tridecyl octanoate, myristyl myristate, and octyl dodecanoate.

4. The curable silicone composition according to claim 1, wherein component (C) is at least one sorbitan fatty acid ester selected from the group consisting of sorbitan monolaurate, sorbitan monopalmitate, sorbitan monostearate, sorbitan monooleate, sorbitan sesquilaurate, sorbitan sesquipalmitate, sorbitan sesquistearate, sorbitan sesquioleate, sorbitan trilaurate, sorbitan tripalmitate, sorbitan tristearate, and sorbitan trioleate.

5. The curable silicone composition according to claim 1, wherein component (C) is at least one polyglycerin selected from the group consisting of monoallyl diglycerin, monoallyl tetraglycerin, triglycerin, and tetraglycerin.

6. The curable silicone composition according to claim 1, wherein component (C) is at least one polyoxyethylene fatty acid glyceryl selected from the group consisting of polyoxyethylene glyceryl caprylate, polyoxyethylene glyceryl (caprylate/caprate), polyoxyethylene glyceryl laurate, polyoxyethylene glyceryl stearate, polyoxyethylene glyceryl oleate, polyoxyethylene glyceryl tallowate, polyoxyethylene coconut oil fatty acid glyceryl, polyoxyethylene glyceryl isostearate, and polyoxyethylene glyceryl triisostearate.

7. The curable silicone composition according to claim 1, wherein the composition is a sealing agent or a coating agent of an optical semiconductor device.

8. An optical semiconductor device comprising a silver electrode or a silver-plated substrate, the electrode or substrate being sealed or covered with a cured product of the curable silicone composition according to claim 1.

9. The curable silicone composition according to claim 1, wherein the content of alkenyl groups with respect to all of the silicon-bonded organic groups in component (A) is from 0.05 to 40 mol %.

10. The curable silicone composition according to claim 1, wherein the content of component (B) is an amount such that the content of silicon-bonded hydrogen atoms in this component is from 0.5 to 5 mol per 1 mol of silicon-bonded alkenyl groups in component (A).

11. The curable silicone composition according to claim 9, wherein the content of component (B) is an amount such that the content of silicon-bonded hydrogen atoms in this component is from 0.5 to 5 mol per 1 mol of silicon-bonded alkenyl groups in component (A).

12. The curable silicone composition according to claim 1, wherein the content of component (C) is an amount of from 0.01 to 7 mass % with respect to the composition.

13. The curable silicone composition according to claim 11, wherein the content of component (C) is an amount of from 0.01 to 7 mass % with respect to the composition.

* * * * *